(12) United States Patent
Harada et al.

(10) Patent No.: US 7,061,181 B2
(45) Date of Patent: Jun. 13, 2006

(54) GAS DISCHARGE PANEL AND ITS PRODUCTION METHOD

(75) Inventors: Hideki Harada, Kawasaki (JP); Tsutomu Ogawa, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 196 days.

(21) Appl. No.: 10/740,818

(22) Filed: Dec. 22, 2003

(65) Prior Publication Data

US 2004/0155585 A1    Aug. 12, 2004

(30) Foreign Application Priority Data

Feb. 10, 2003    (JP) ............................ 2003-032724

(51) Int. Cl.
*H01J 17/49* (2006.01)
(52) U.S. Cl. ........................................ 313/586; 313/489
(58) Field of Classification Search ........ 313/582–587, 313/484–492
See application file for complete search history.

(56) References Cited

U.S. PATENT DOCUMENTS

| | | | |
|---|---|---|---|
| 6,326,064 B1 | 12/2001 | Denison et al. | ............. 427/571 |
| 6,376,398 B1* | 4/2002 | Lee et al. | ..................... 501/32 |
| 6,450,849 B1 | 9/2002 | Harada | ......................... 445/24 |
| 6,798,144 B1* | 9/2004 | Mori et al. | ............... 315/169.1 |
| 6,803,723 B1* | 10/2004 | Yamashita et al. | .......... 313/586 |
| 6,879,107 B1* | 4/2005 | Hirano et al. | ............... 313/587 |

FOREIGN PATENT DOCUMENTS

| | | |
|---|---|---|
| JP | 2000-21304 | 1/2000 |
| JP | 2001-155647 | 6/2001 |

OTHER PUBLICATIONS

Idris, et al., "Film Characteristics of Low-Temperature Plasma-Enhanced Chemical Vapor Deposition Silicon Dioxide Using Tetraisocyanatesilane and Oxygen", Japanese Journal of Applied Physics, Publication Office of Applied Physics, vol. 37, No. 12A, Part 1, Dec. 1998, pp. 6562-6568.
Patent Abstracts of Japan, vol. 18, No. 490, Sep. 13, 1994, for Japanese Publication No. 06 158327, published Jun. 7, 1994.

* cited by examiner

*Primary Examiner*—Edward J. Glick
*Assistant Examiner*—Elizabeth Keaney
(74) *Attorney, Agent, or Firm*—Staas & Halsey LLP

(57) ABSTRACT

A gas discharge panel having a plasma display panel includes a pair of substrates facing each other for forming a discharge space; an electrode formed on at least one the substrate; and a dielectric layer for covering the electrode; wherein the dielectric layer contains $SiO_2$ as a main component and is composed of a material containing hydrogen of $5 \times 10^{21}$ atom/cm$^3$ or less.

15 Claims, 5 Drawing Sheets

GAS DISCHARGE PANEL AND ITS PRODUCTION METHOD

CROSS-REFERENCE TO RELATED APPLICATION

This application is related to Japanese Patent Application No. 2003-32724 filed on Feb. 10, 2003, whose priority is claimed under 35 USC § 119, the disclosure of which is incorporated by reference in its entirety.

BACKGROUND OF THE INVENTION

1. Field of the Invention

The present invention relates to a gas discharge panel such as a plasma display panel (PDP) and its production method. The gas discharge panel according to the present invention is suitably used for household TVs, computer monitors, as well as large-screen displays for displaying information provided at stations, airports, stock exchanges, factories, schools and the like.

2. Description of Related Art

Conventionally, a plasma display panel (PDP), a plasma addressing liquid crystal (PALC) and the like are known as a gas discharge panel. Among these gas discharge panels, the PDP is characterized by large size and small thickness, and is one of the largest selling display devices at the present time.

FIG. 1 illustrates a schematic perspective view of a representative PDP which is in practical use.

The PDP of FIG. 1 is constituted of a front side substrate and a rear side substrate.

The front side substrate 10 is generally comprised of a plurality of display electrodes (sustain electrodes X, Y to be paired) formed on a glass substrate 11, a dielectric layer 17 formed so as to cover the display electrodes X, Y, and a protective film 18 formed on the dielectric layer 17 and exposed to a discharge space.

The display electrodes X, Y are each comprised of a transparent electrode film 41, and a bus electrode 42 laminated on an edge of the transparent electrode film 41 for reducing the resistance of the film 41. The bus electrode 42 is narrower in width than the transparent electrode film.

The rear side substrate 20 is generally comprised of a plurality of address electrodes A formed on a glass substrate 21, a dielectric layer 24 covering the address electrodes A, a plurality of band-shaped barrier ribs 29 formed on the dielectric layer 24 and between adjacent address electrodes, and phosphor layers 28R, 28G and 28B each formed between the barrier ribs to extend onto the walls of the barrier ribs.

The aforesaid front side and rear side substrates are arranged with the display electrodes and address electrodes, which are placed to be adjacent to each other, opposed so that both the electrodes intersect at right angles, and the periphery of the substrates is sealed with a sealing glass layer and a space surrounded by the barrier ribs 29 is filled with a discharge gas (for example, Ne—Xe gas), thereby to form a PDP 1. In FIG. 1, R, G and B respectively represent unit light-emitting areas of red, green and blue, and one pixel is constituted of RGB arranged in a lateral direction.

In the aforesaid construction of the PDP, when an electric field is applied between the display electrodes and address electrodes, a discharge gas is excited and ionized therebetween to discharge vacuum ultraviolet rays. At this time, the discharged vacuum UV rays are in contact with a phosphor, so that visible light is discharged by the phosphor for utilizing it for display.

The dielectric layer is generally formed by using of a glass paste obtained by dispensing low-melting glass into a vehicle containing ethyl cellulose resin as a main component or a glass sheet obtained by dispensing the low-melting glass into an acrylic resin or the like. The glass paste or glass sheet is baked to burn out the resin components for melting the low-melting glass contained therein, thereby forming the dielectric layer.

Japanese Unexamined Patent Publication No.2000-21304 has reported recently a PDP comprising a dielectric layer formed by a vapor phase growth method such as a CVD-method or the like instead of the dielectric layer composed of the low-melting glass, in order to improve the panel performance of a PDP.

Japanese Unexamined Patent Publication No.2001-155647 proposes a cover film provided on a dielectric film in order to suppress the deterioration of a phosphor by a $NH_3$ base gas generated by the dielectric film formed by the CVD method.

In order to enhance the producing speed of the PDP, it is desired to increase the forming speed of the dielectric layer. However, even if only the layer forming speed is raised, an impurity gas is increased in the dielectric layer. Accordingly, the impurity gas is discharged, resulting in deterioration of the phosphor. The cover film is also insufficient for suppressing the discharge of impurity gas. When the layer forming speed is further increased, a number of defects such as a crack in the dielectric layer, the nonuniform thickness of the dielectric layer and the like will occur. These defects allow the dielectric layer to be partially deteriorated, so that a panel lifetime is shortened.

SUMMARY OF THE INVENTION

The inventors of the present invention have studied a relationship between the forming conditions of the dielectric layer and the amount of gas discharged in the panel or a composition of the dielectric layer, and a relationship between the amount of the gas and the panel lifetime, and therefore attained the present invention.

According to the present invention, there is provided a gas discharge panel including a PDP, comprising: a pair of substrates facing each other for forming a discharge space; an electrode formed on at least one the substrate; and a dielectric layer for covering the electrode; wherein the dielectric layer contains $SiO_2$ as a main component and is composed of a material containing hydrogen of $5 \times 10^{21}$ atom/cm$^3$ or less and/or nitrogen of $3 \times 10^{20}$ atom/cm$^3$ or less.

In another aspect of the present invention, there is provided a method of producing the above mentioned gas discharge panel, wherein a dielectric layer is formed by a vapor phase growth method.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The gas discharge panel according to the present invention has at least a dielectric layer, and is not particularly limited as long as it performs display by utilizing gas discharge. For example, a PDP, PALC and the like may be mentioned as the gas discharge panel.

According to the present invention, the dielectric layer contains $SiO_2$ as a main component and is composed of a material containing hydrogen of $5 \times 10^{21}$ atom/cm$^3$ or less and/or nitrogen of $3 \times 10^{20}$ atom/cm$^3$ or less.

Here, the main component means that a content ratio of $SiO^2$ in the dielectric layer is 50 wt % or higher, more preferably a content ratio is 90 wt% or higher (the maximum ratio is 100 wt %). Components except $SiO_2$ include hydrogen, nitrogen, carbon, phosphorus, boron and others. Among them, phosphorus and/or boron may be intentionally added to the dielectric layer for the purpose of controlling the film stress and etching speed of the dielectric layer. The concentration of phosphorus and boron is preferably 10 wt % or less, more preferably 8 wt % or less (the minimum ratio is 0 wt %).

According to the present invention, the hydrogen content of the dielectric layer is $5 \times 10^{21}$ atom/cm$^3$ or less and/or the nitrogen content thereof is $3 \times 10^{20}$ atom/cm$^3$ or less. The reason for defining the range of the hydrogen and nitrogen content will be hereinafter described by taking the PDP as an example.

Figure 2:
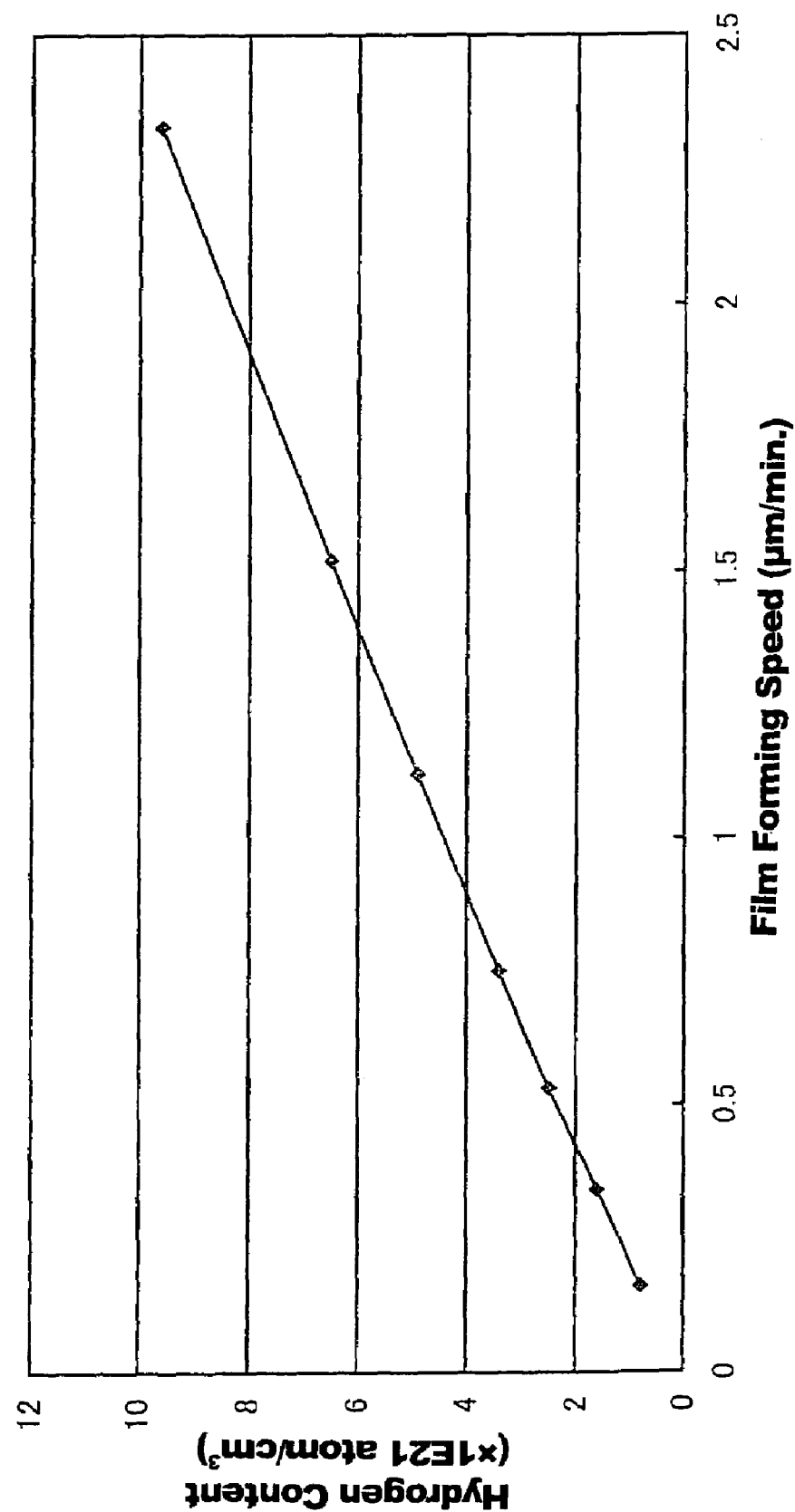
FIG. 2 is a diagram for illustrating a relationship between a forming speed of a dielectric layer and the hydrogen content of the dielectric layer.

FIG. 2 is a diagram for illustrating a relationship between the forming speed of the dielectric layer and the hydrogen content of the dielectric layer. It is understood from FIG. 2 that the higher the layer forming speed is, the faster the hydrogen content is.

Figure 3:
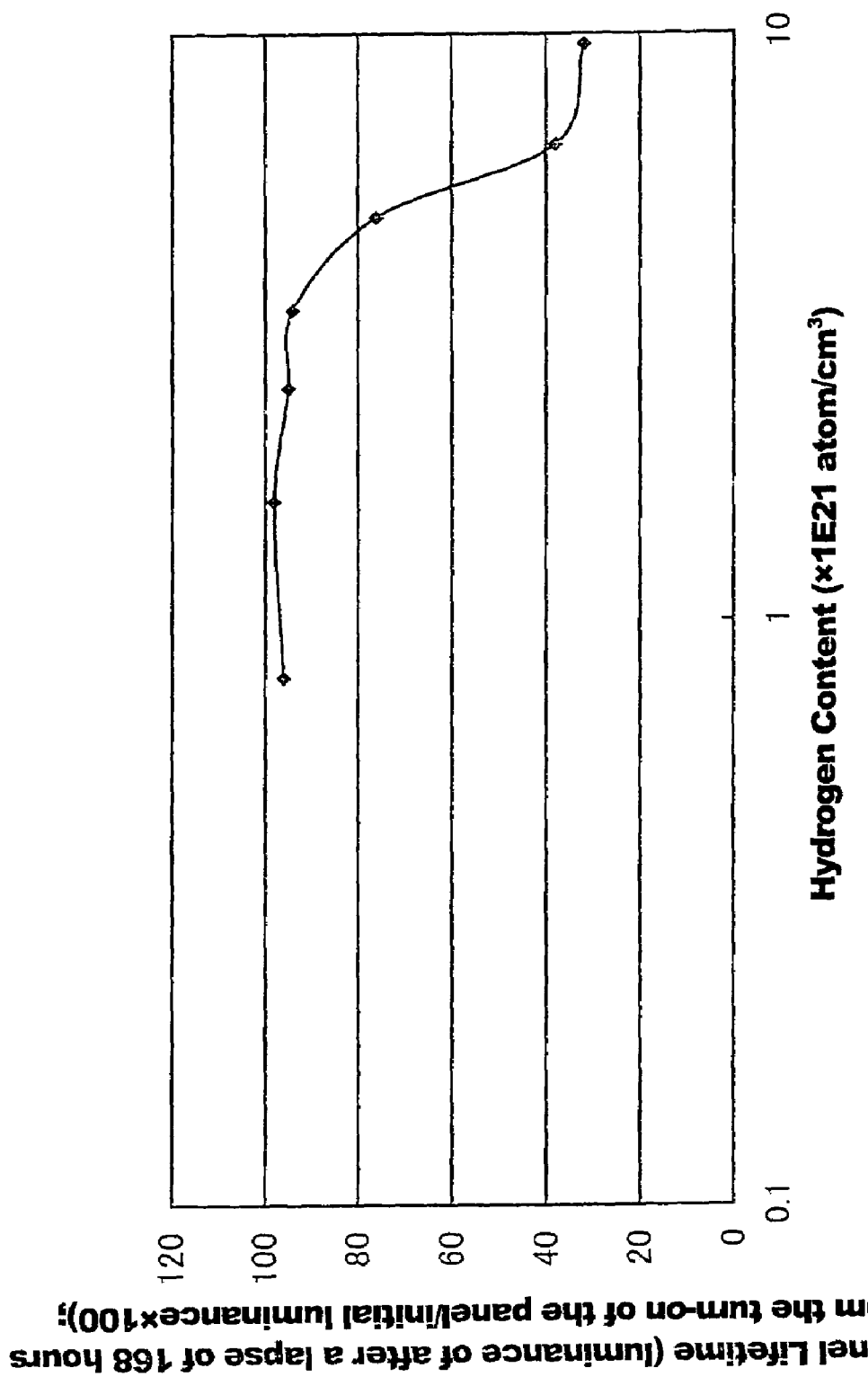
FIG. 3 is a diagram for illustrating a relationship between the hydrogen content of the dielectric layer and a panel lifetime (the percentage of luminance deterioration with respect to that of initial luminance after a lapse of 168 hours from the turn-on of the panel)

FIG. 3 is a diagram for illustrating a relationship between the hydrogen content of the dielectric layer and a panel lifetime (the percentage of luminance deterioration with respect to that of initial luminance after a lapse of 168 hours from the turn-on of the panel). It is understood from FIG. 3 that the panel lifetime becomes sharply shorter when the hydrogen content of the dielectric layer exceeds a certain amount.

As understood from FIGS. 2 and 3, the hydrogen content of the dielectric layer to be formed needs to be within a certain amount range for forming rapidly the dielectric layer while prolonging the panel lifetime. The certain amount of hydrogen is in the range of $5 \times 10^{21}$ atom/cm$^3$ or less, more preferably in the range of $1 \times 10^{21}$ to $3 \times 10^{21}$ atom/cm$^3$.

Figure 4:
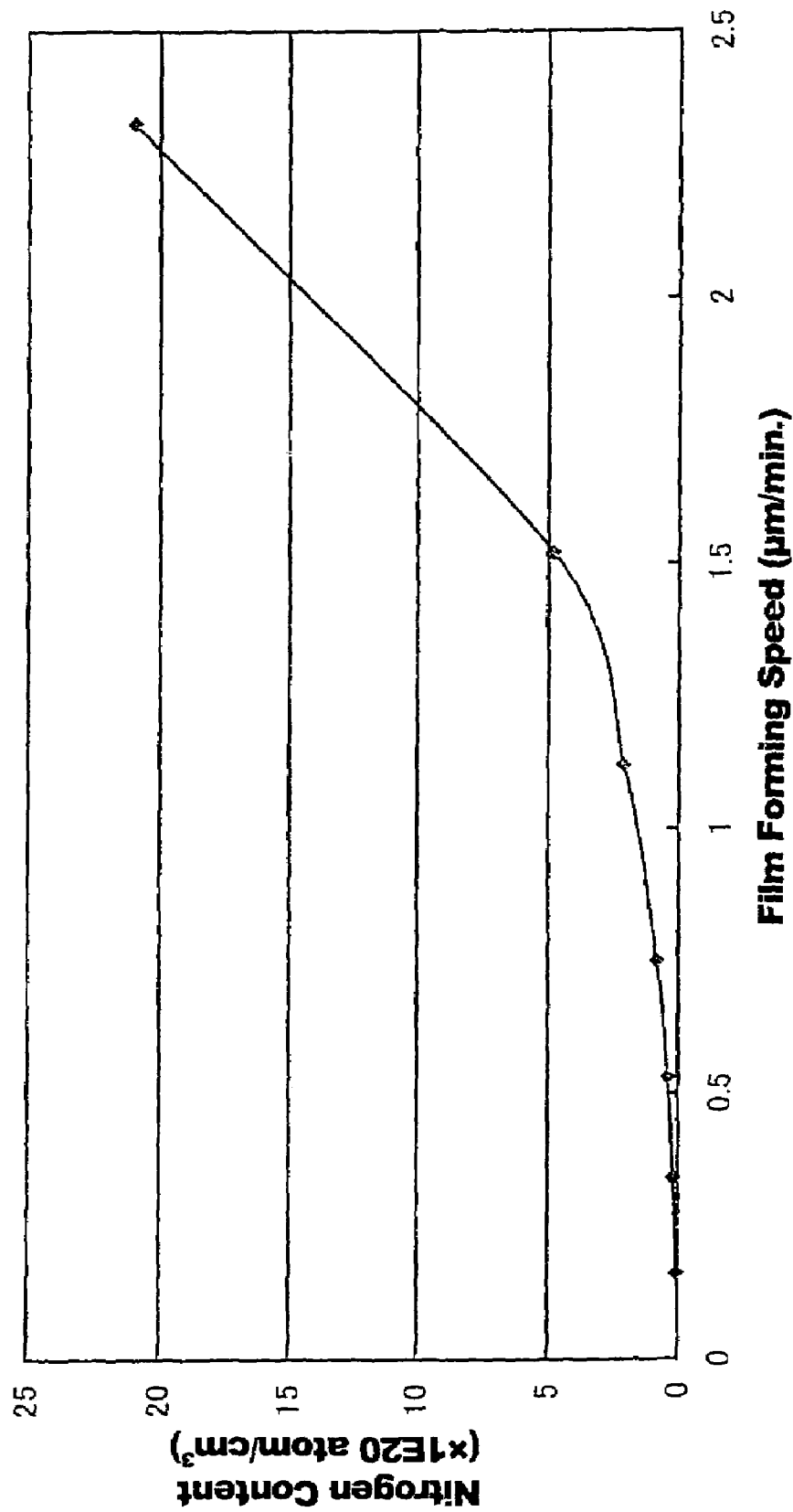
FIG. 4 is a diagram for illustrating a relationship between the forming speed of the dielectric layer and the nitrogen content of the dielectric layer.
Figure 5:
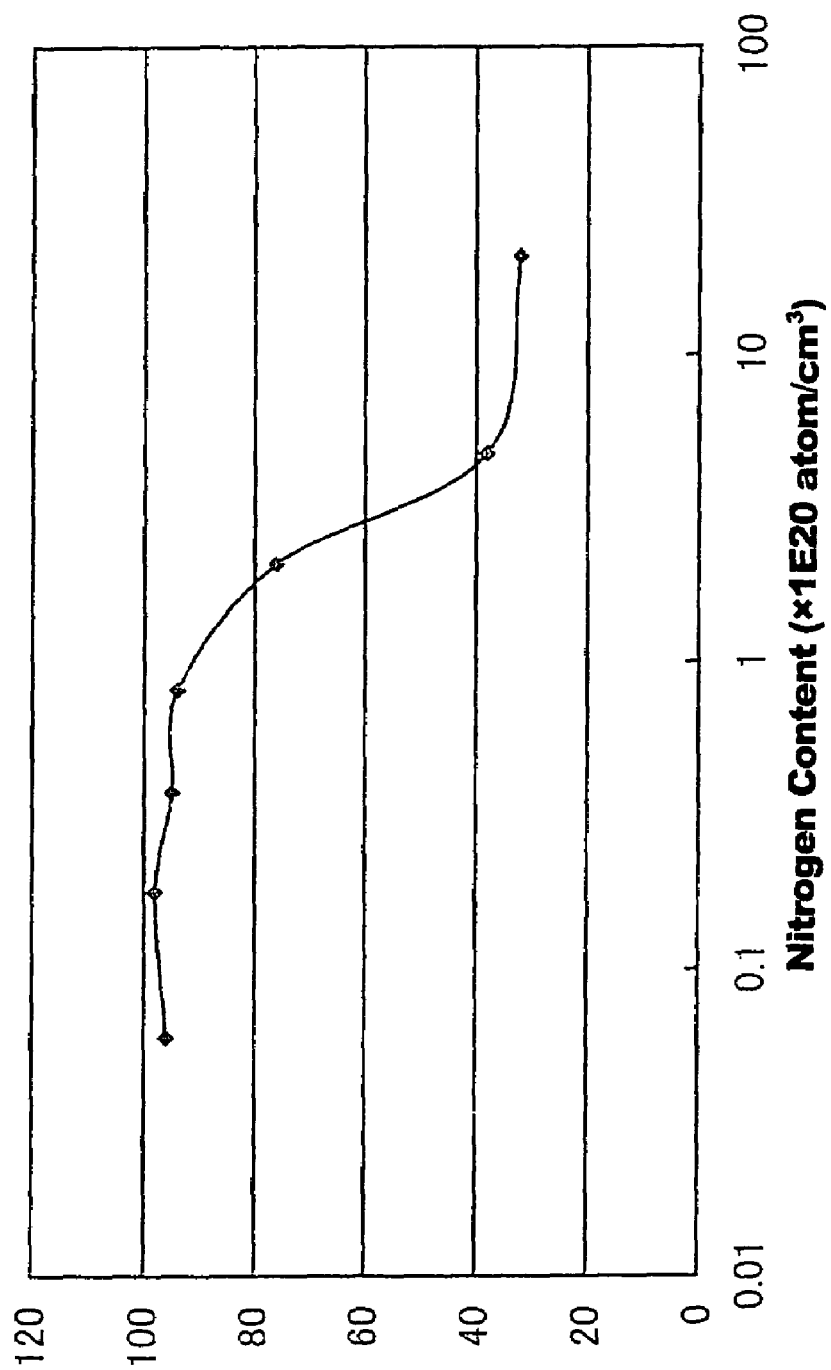
FIG. 5 is a diagram for illustrating a relationship between the nitrogen content of the dielectric layer and the panel lifetime (the percentage of luminance deterioration with respect to that of initial luminance after a lapse of 168 hours from the turn-on of the panel).

FIG. 4 is a diagram for illustrating a relationship between the forming speed of the dielectric layer and the nitrogen content of the dielectric layer, and FIG. 5 is a diagram for illustrating a relationship between the nitrogen content of the dielectric layer and the panel lifetime (the percentage of luminance deterioration with respect to that of initial luminance after a lapse of 168 hours from the turn-on of the panel). The same tendency is said for the case of nitrogen in FIGS. 4 and 5, as in the case of hydrogen in FIGS. 2 and 3.

As understood from FIGS. 4 and 5, the nitrogen content of the dielectric layer to be formed needs to be within a certain amount range for forming rapidly the dielectric layer while prolonging the panel lifetime. The certain amount of nitrogen is in the range of $3 \times 10^{20}$ atom/cm$^3$ or less, more preferably in the range of $1 \times 10^{19}$ to $1 \times 10^{20}$ atom/cm$^3$.

According to the present invention, it is preferred that the hydrogen content is $5 \times 10^{21}$ atom/cm$^3$ or less and the nitrogen content is $3 \times 10^{20}$ atom/cm$^3$ or less. A more preferable combination is a hydrogen content of $1 \times 10^{21}$ to $5 \times 10^{21}$ atom/cm$^3$ and a nitrogen content of $1 \times 10^{19}$ to $3 \times 10^{20}$ atom/cm$^3$. A still more preferable combination is a hydrogen content of $1 \times 10^{21}$ to $3 \times 10^{21}$ atom/cm$^3$ and a nitrogen content of $1 \times 10^{19}$ to $1 \times 10^{20}$ atom/cm$^3$.

In FIGS. 3 to 5, the dielectric layer is formed by a plasma CVD method under the conditions that a susceptor area is set to 2000 cm$^3$, a RF output is set to 2000 W and a flow rate of $SiH_4$ gas is set to 1/10, except that the flow rate of $SiH_4$ gas varies from 100 to 2000 cm$^3$. In FIGS. 3 and 5, the measurement of the panel lifetime is performed as follows and the construction of the PDP is as follows.

Display electrode: a width of transparent electrodes of 300 μm and that of bus electrodes of 100 μm Discharge gap between display electrodes: 100 μm The thickness of the dielectric layer: 10 μm The height of barrier ribs: 100 μm Discharge gas: Ne—Xe (5%)

Gas pressure: 500 Torr

The thickness of a phosphor layer: 20 μm

Phosphor material for red: $(Y, Gd)BO_3:Eu^{3+}$

Phosphor material for green: $Zn_2SiO_4:Mn^{2+}$

Phosphor material for blue: $BaMgAl_{10}O_{17}:Eu^{2+}$

An exemplary dielectric layer formed by the plasma CVD method is described above. However, a vapor phase growth method such as a CVD method except for the plasma CVD method, a sputtering, a vapor deposition or the like can be employed as long as the dielectric layer having the above specified hydrogen and/or nitrogen content can be formed. In the present invention, the plasma CVD method is preferably employed from the viewpoint of controlling the warp of the substrate and lowering a cost.

Material gas to be used for forming the dielectric layer by means of the plasma CVD method includes a silicon source such as silane: $SiH_4$, tetraethoxysilane: $Si(OC_2H_5)_4$, methyltrimethoxysilane: $CH_3Si(OCH_3)_3$ or the like and a non-silicon source such as $N_2O$, $CO_2$, CO, $H_2O$, $O_2$ or the like.

Layer forming conditions such as susceptor area: 2000 to 15000 cm$^2$, RF output: 2000 to 20000 W, temperature: 360 to 450° C., pressure: 2 to 3 Torr and the like may be mentioned for forming the dielectric layer by means of the plasma CVD method, but the above values may vary depending on the size of the substrate desirable for forming the dielectric layer and the property of the dielectric layer.

The RF output/susceptor area is preferably 0.82 W/cm$^2$ or higher, more preferably 0.9 W/cm$^2$ or higher in order to set the hydrogen content at $5 \times 10^{21}$ atom/cm$^3$ or less and the nitrogen content at $3 \times 10^{20}$ atom/cm$^3$ or less.

A three electrode AC-type surface discharge PDP shown in FIG. 1 will be described below as an exemplary gas discharge panel according to the present invention capable of using a protective film. The following examples are provided only for illustrative purpose, and the invention is not limited thereto.

Figure 1:
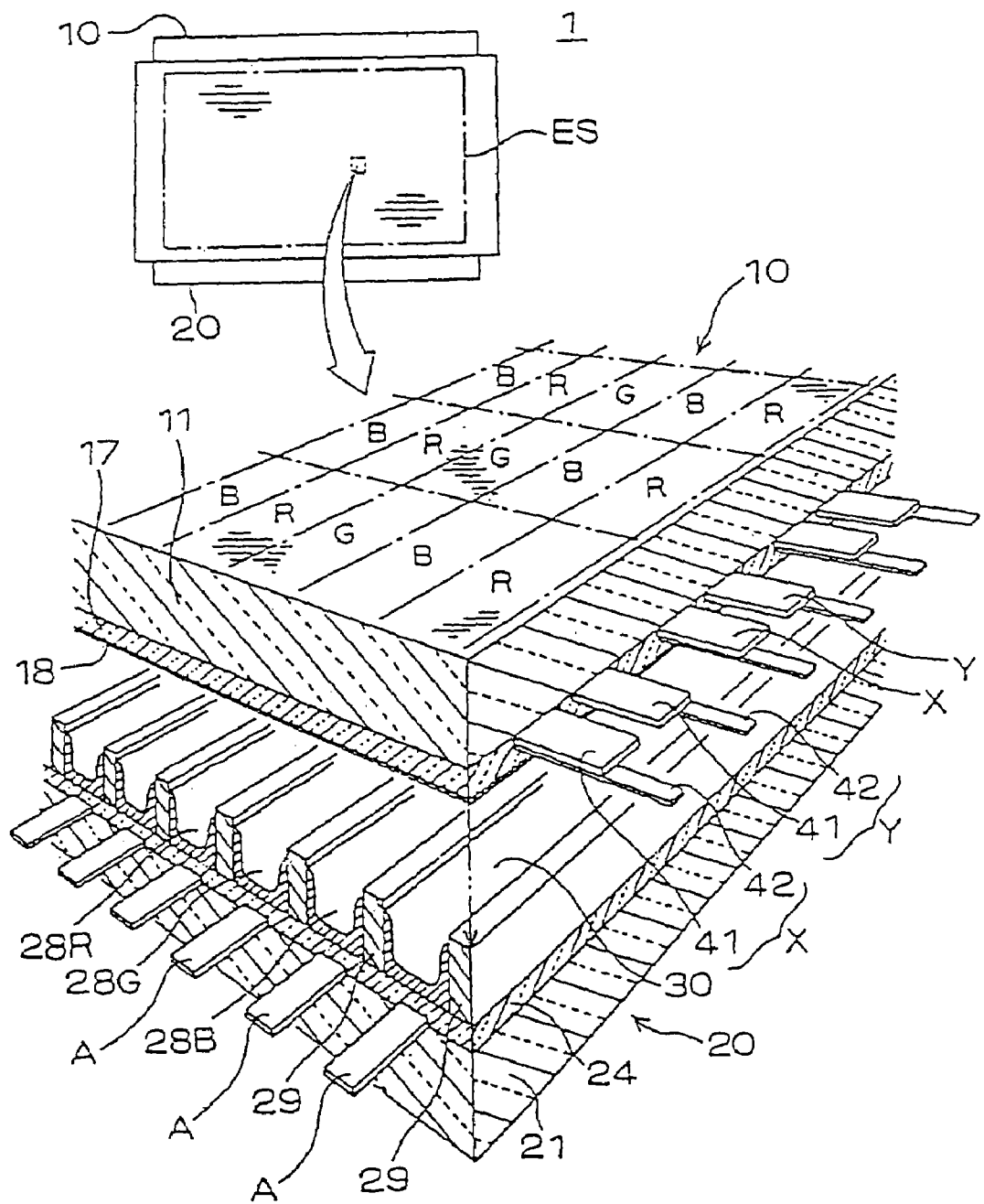
FIG. 1 is a schematic perspective view of a PDP.

A PDP 1 shown in FIG. 1 is constituted of a front side substrate and a rear side substrate.

The front side substrate 10 is generally comprised of a plurality of display electrodes X, Y to be paired which are formed on a glass substrate 11, a dielectric layer 17 formed so as to cover the display electrodes, and a protective film 18 formed on the dielectric layer 17 and exposed to a discharge space.

The display electrodes are comprised of transparent electrode films 41 in the form of stripes or dots per discharge cell unit, and bus electrodes 42 laminated in stripes on an edge of the transparent electrode films 41 for reducing the resistance of the films 41. Each bus electrode 42 is narrower in width than each transparent electrode film.

As the method of forming the transparent electrode film 41, may be mentioned a method in which a paste containing an organic compound of a metal constituting the transparent electrode film is applied and baked, thereby forming the transparent electrode film.

The dielectric layer having the above specified hydrogen and/or nitrogen content can be used for the dielectric layer 17.

The rear side substrate 20 is generally comprised of a plurality of address electrodes A formed in stripes on a glass substrate 21, a dielectric layer 24 formed so as to cover the address electrodes A, a plurality of band-shaped barrier ribs 29 formed on the dielectric layer 24 and between adjacent address electrodes A, and phosphor layers 28R,28G and 28B each formed between the barrier ribs to extend onto the walls of the barrier ribs.

Each of the barrier ribs 29 can be formed by applying a paste composed of low-melting glass and a binder on the dielectric layer 24 so as to form a film, baking the applied paste, and then cutting it by a sandblasting method with the use of a mask having a barrier rib shape. Where a photosensitive resin is used as the binder, the barrier rib can also be formed by exposing and developing the applied paste with the use of a mask having a predetermined shape, followed by baking.

The phosphor layers (28R, 28G, 28B) can be formed by applying a paste between the barrier ribs 29 and then baking the paste in an inert atmosphere. In the paste, a particle-form phosphor is dispersed in a solution in which a binder is dissolved.

The dielectric layer having the above specified hydrogen and/or nitrogen content can be used for the dielectric layer 24. In the rear side substrate, the barrier rib 29 may be directly formed on the glass substrate 21 without forming the dielectric layer.

The aforesaid front side and rear side substrates (10,20) are arranged with the display electrodes (X,Y) and address electrodes A, which are placed to be adjacent to each other, opposed so that both the electrodes intersect at right angles, and a space surrounded by the barrier ribs 29 is filled with a discharge gas, thereby to form the PDP 1.

The PDP to which the present method may be applied is not limited to the PDP shown in FIG. 1, but any PDP may be used insofar as it has a dielectric layer for covering discharge electrodes, such as an opposed discharge PDP, a transparent type PDP in which a phosphor layer is provided on a front side substrate and a PDP having a two electrode structure. Additionally, the barrier rib may be of a mesh form.

EXAMPLE

The present invention will hereinafter be described in further detail by way of examples, but the invention is not limited thereto.

Example 1

Display electrodes comprised of transparent electrodes and bus electrodes were formed on a substrate by a known method.

SiH$_4$ and N$_2$O as material gas were allowed to flow into a plasma CVD apparatus having a susceptor area of 2000 cm$^2$ at flow rates of 900 sccm and 9000 sccm, respectively under the conditions of a RF output of 2.0 kW, a temperature of 400° C. and a pressure of 3.0 Torr, whereby a 5-μm thick dielectric layer was formed at a layer forming speed of 0.75 μm per minute for covering the display electrodes.

The hydrogen and nitrogen content of the formed dielectric layer was measured by SIMS (secondary ion mass spectrometry). As a result, the hydrogen content and the nitrogen content were $3.4 \times 10^{21}$ atom/cm$^3$ and $0.82 \times 10^{20}$ atom/cm$^3$, respectively.

A front side substrate was obtained by forming a MgO film having a thickness of 1.0 μm by means of a known electron beam evaporation.

Subsequently, by means of a known method, address electrodes were formed on a substrate, a plurality of band-shaped barrier ribs were formed on the substrate and between adjacent address electrodes, and a phosphor layer was formed between the barrier ribs, whereby a rear side substrate was obtained.

The obtained front side and rear side substrates were bonded to produce a PDP. The initial luminance of the produced PDP and the luminance thereof after a lapse of 168 hours were measured. Consequently, the luminance after the lapse of 168 hours was 94% of the initial luminance, and a decline in luminance was suppressed.

A dielectric layer was formed in the same manner as described above except that the RF output value was changed, and the hydrogen and nitrogen content of the dielectric layer was measured. The result is shown in Table 1.

TABLE 1

| RF output (W) | Hydrogen content ($\times 10^{21}$ atom/cm$^3$) | Nitrogen content ($\times 10^{20}$ atom/cm$^3$) |
| --- | --- | --- |
| 2900 | 0.8 | 0.06 |
| 2600 | 1.6 | 0.18 |
| 2300 | 2.5 | 0.38 |
| 2000 | 3.4 | 0.82 |
| 1700 | 4.9 | 2.1 |
| 1400 | 6.5 | 4.8 |
| 1100 | 9.6 | 21 |

As seen from Table 1, an increase in the hydrogen and nitrogen content can be suppressed by increasing the RF output.

Example 2

A dielectric layer was formed at a layer forming speed of 0.71 μm per minute in the same manner as in Example 1, except that the susceptor area was set to 6700 cm$^2$, the RF output was set to 6.0 kW and the flow rates of SiH$_4$ and N$_2$O were set to 3000 sccm and 30000 sccm, respectively.

The hydrogen and nitrogen content of the formed dielectric layer was measured by SIMS (secondary ion mass spectrometry). As a result, the hydrogen content and the nitrogen content were $4.2 \times 10^{21}$ atom/cm$^3$ and $1.2 \times 10^{20}$ atom/cm$^3$, respectively.

A PDP was produced in the same manner as in Example 1. The initial luminance of the produced PDP and the luminance thereof after a lapse of 168 hours were measured. Consequently, the luminance after the lapse of 168 hours was 98% of the initial luminance, and a decline in luminance was suppressed.

A dielectric layer was formed in the same manner as described above except that the RF output value was changed, and the hydrogen and nitrogen content of the dielectric layer was measured. The result is shown in Table 2.

TABLE 2

| RF output (W) | Hydrogen content (×10$^{21}$ atom/cm$^3$) | Nitrogen content (×10$^{20}$ atom/cm$^3$) |
|---|---|---|
| 7500 | 1.3 | 0.08 |
| 7000 | 2.1 | 0.3 |
| 6500 | 2.8 | 0.7 |
| 6000 | 4.2 | 1.2 |
| 5500 | 5.8 | 3.4 |
| 5000 | 7.1 | 11.2 |
| 4500 | 8.9 | 34.2 |

As seen from Table 2, in the same manner as Table 2, an increase in the hydrogen and nitrogen content can be suppressed by increasing the RF output.

When the initial luminance of the produced PDP and the luminance thereof after a lapse of 168 hours were measured at a RF output of 5.0 kW as shown in Table 2, the luminance after the lapse of 168 hours was 54% of the initial luminance. That was, a sharp decline in luminance was observed. At this time, the layer forming speed was 0.84 μm per minute.

According to the present invention, the hydrogen and/or nitrogen content of the dielectric layer constituting the gas discharge panel is defined within a specific content range, so that deaeration affecting the panel lifetime is suppressed. Therefore, it is possible to provide a low-priced display device with a high reliability.

What is claimed is:

1. A gas discharge panel including a plasma display panel, comprising:
    a pair of substrates facing each other for forming a discharge space;
    an electrode formed on at least one the substrate; and
    a dielectric layer for covering the electrode;
    wherein the dielectric layer contains SiO$_2$ as a main component and is composed of a material containing hydrogen of $5 \times 10^{21}$ atom/cm$^3$ or less.

2. The gas discharge panel according to claim 1, wherein the hydrogen content is in the range of $1 \times 10^{21}$ to $5 \times 10^{21}$ atom/cm$^3$.

3. A gas discharge panel including a plasma display panel, comprising:
    a pair of substrates facing each other for forming a discharge space;
    an electrode formed on at least one the substrate; and
    a dielectric layer for covering the electrode;
    wherein the dielectric layer contains SiO$_2$ as a main component and is composed of a material containing nitrogen of $3 \times 10^{20}$ atom/cm$^3$ or less.

4. The gas discharge panel according to claim 3, wherein the nitrogen content is in the range of $1 \times 10^{19}$ to $3 \times 10^{20}$ atom/cm$^3$.

5. A gas discharge panel including a plasma display panel, comprising:
    a pair of substrates facing each other for forming a discharge space;
    an electrode formed on at least one the substrate; and
    a dielectric layer for covering the electrode;
    wherein the dielectric layer contains SiO$_2$ as a main component and is composed of a material containing hydrogen of $5 \times 10^{21}$ atom/cm$^3$ or less and nitrogen of $3 \times 10^{20}$ atom/cm$^3$ or less.

6. The gas discharge panel according to claim 5, wherein the hydrogen content is in the range of $1 \times 10^{21}$ to $5 \times 10^{21}$ atom/cm$^3$ and the nitrogen content is in the range of $1 \times 10^{19}$ to $3 \times 10^{20}$ atom/cm$^3$.

7. A method of producing a gas discharge panel of claim 1, wherein the dielectric layer is formed by a vapor phase growth method.

8. The method of producing a gas discharge panel according to claim 7, wherein the dielectric layer is formed by a plasma CVD method with the use of SiH$_4$ and N$_2$O as material gas.

9. The method of producing a gas discharge panel according to claim 8, wherein the dielectric layer is formed by the plasma CVD method under conditions that a RF output/susceptor area is 0.82 W/cm$^2$ or higher.

10. A method of producing a gas discharge panel of claim 3, wherein the dielectric layer is formed by a vapor phase growth method.

11. The method of producing a gas discharge panel according to claim 10, wherein the dielectric layer is formed by a plasma CVD method with the use of SiH$_4$ and N$_2$O as material gas.

12. The method of producing a gas discharge panel according to claim 11, wherein the dielectric layer is formed by the plasma CVD method under conditions that a RF output/susceptor area is 0.82 W/cm$^2$ or higher.

13. A method of producing a gas discharge panel of claim 5, wherein the dielectric layer is formed by a vapor phase growth method.

14. The method of producing a gas discharge panel according to claim 13, wherein the dielectric layer is formed by a plasma CVD method with the use of SiH$_4$ and N$_2$O as material gas.

15. The method of producing a gas discharge panel according to claim 14, wherein the dielectric layer is formed by the plasma CVD method under conditions that a RF output/susceptor area is 0.82 W/cm$^2$ or higher.

* * * * *

UNITED STATES PATENT AND TRADEMARK OFFICE
CERTIFICATE OF CORRECTION

| | | |
|---|---|---|
| PATENT NO. | : 7,061,181 B2 | Page 1 of 1 |
| APPLICATION NO. | : 10/740818 | |
| DATED | : June 13, 2006 | |
| INVENTOR(S) | : Hideki Harada et al. | |

It is certified that error appears in the above-identified patent and that said Letters Patent is hereby corrected as shown below:

Col. 8, line 27, delete "producing,a" and insert --producing a--, therefor.

Signed and Sealed this

Twenty-first Day of November, 2006

JON W. DUDAS
*Director of the United States Patent and Trademark Office*